United States Patent [19]

Chang

[11] Patent Number: 5,233,623
[45] Date of Patent: Aug. 3, 1993

[54] INTEGRATED SEMICONDUCTOR LASER WITH ELECTRONIC DIRECTIVITY AND FOCUSING CONTROL

[75] Inventor: Sheldon S. L. Chang, Port Jefferson, N.Y.

[73] Assignee: Research Foundation of State University of New York, Albany, N.Y.

[21] Appl. No.: 875,387

[22] Filed: Apr. 29, 1992

[51] Int. Cl.$^5$ ............................................. H01S 3/19
[52] U.S. Cl. ...................................... 372/46; 372/92; 372/38; 372/97; 372/50
[58] Field of Search ...................... 372/46, 45, 50, 97, 372/92, 38, 6, 44

[56] References Cited

U.S. PATENT DOCUMENTS

| | | |
|---|---|---|
| 3,992,682 | 11/1976 | White et al. |
| 4,493,085 | 1/1985 | Valley |
| 4,499,437 | 2/1985 | Blazey |
| 4,831,333 | 5/1989 | Welch |
| 4,941,146 | 7/1990 | Kobayashi ............................ 372/45 |
| 4,995,047 | 2/1991 | Hadley et al. ........................ 372/50 |
| 5,034,627 | 7/1991 | Ayral et al. |
| 5,048,936 | 9/1991 | Hatori |
| 5,067,798 | 11/1991 | Tomoyasu |

*Primary Examiner*—Léon Scott, Jr.
*Attorney, Agent, or Firm*—Hoffmann & Baron

[57] ABSTRACT

An integrated semiconductor laser device includes electronic direction and focusing control. The integrated semiconductor laser device may be used for either transmitting output laser beams or as a laser amplifier for receiving incoming laser beams. The direction and focusing control of the device operates by applying electric current to electrodes coupled to an active channel within an extension chamber of the integrated semiconductor laser device. The applied currents inject a minority carrier density distribution into the active channel. Since the speed of light within a semiconductor changes with minority carrier density distribution, a laser beam wave front may be shaped by the injected minority carrier density distribution to direct and/or focus a laser light beam. The direction and focusing control is completely integrated within the semiconductor laser device and time constants for the electronic direction and focusing control are in nanoseconds.

16 Claims, 15 Drawing Sheets

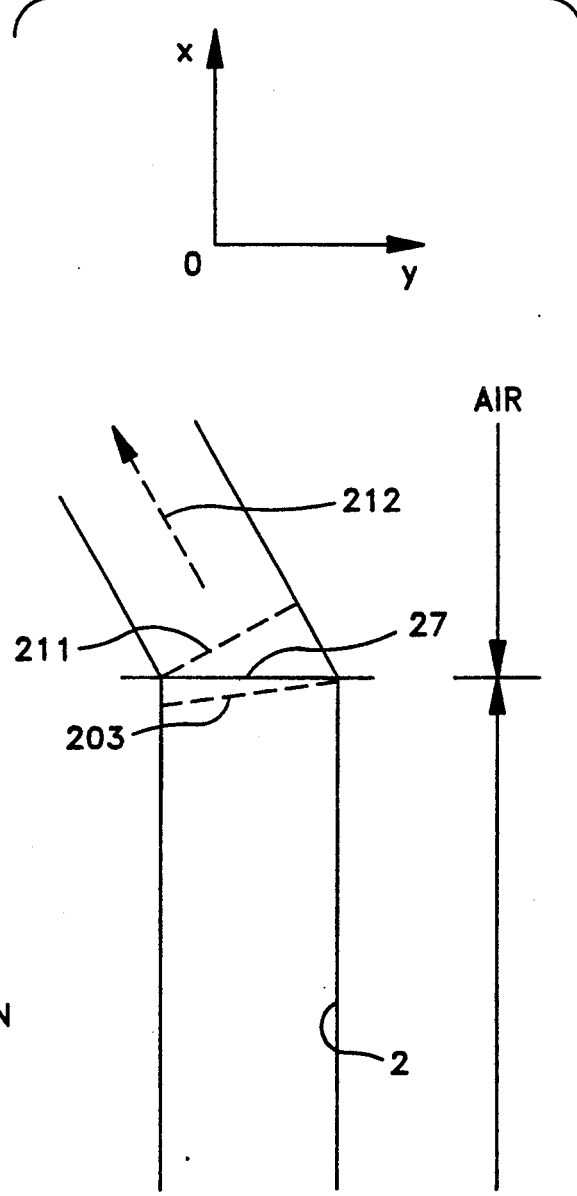

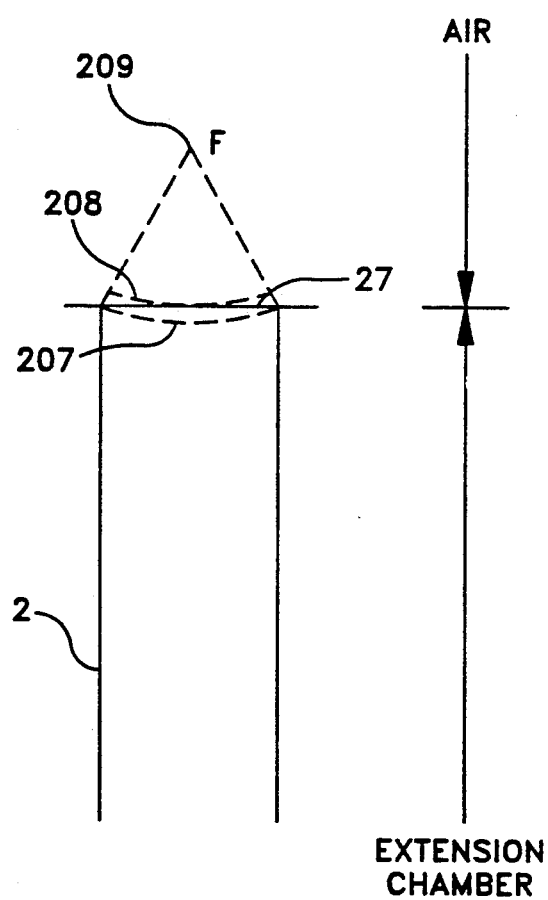
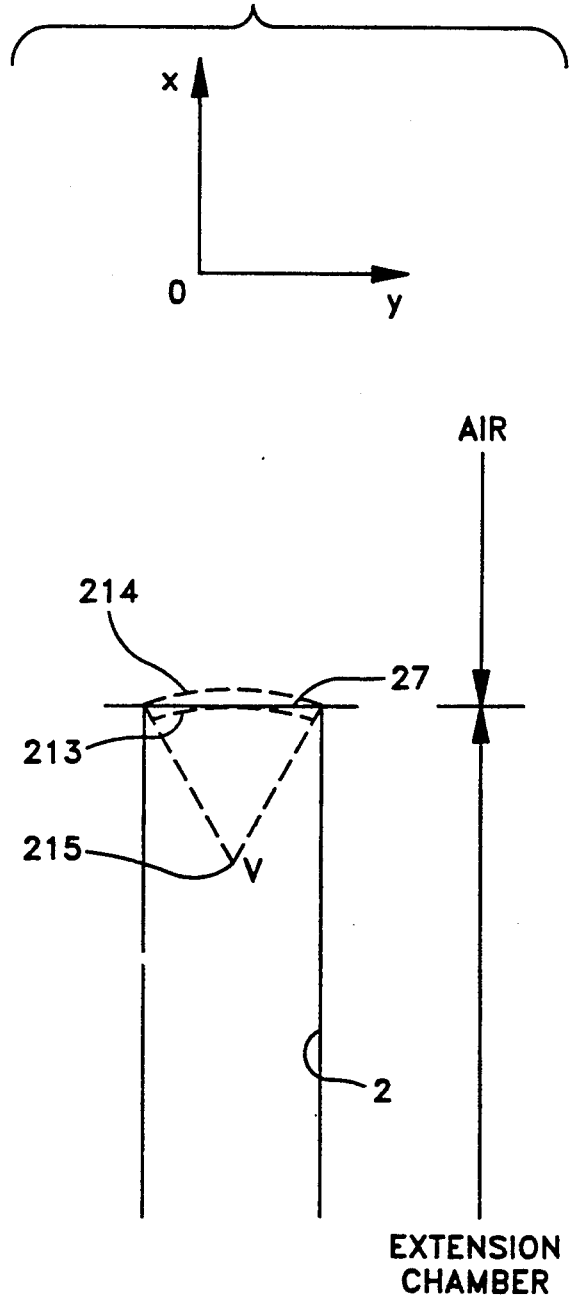

FIG-14
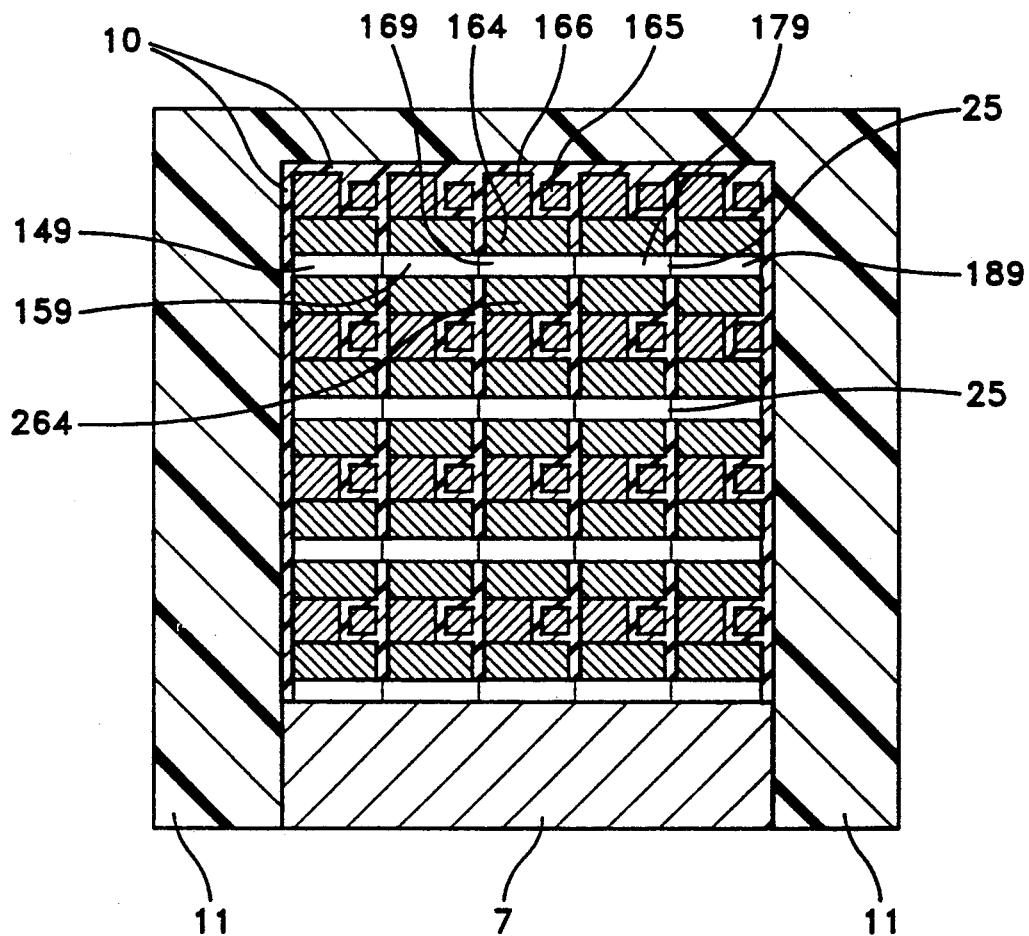
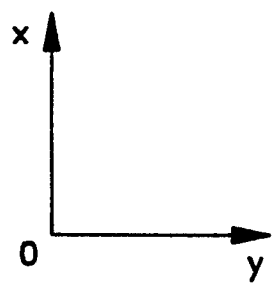

INTEGRATED SEMICONDUCTOR LASER WITH ELECTRONIC DIRECTIVITY AND FOCUSING CONTROL

BACKGROUND OF THE INVENTION

1. Field of the Invention

The present invention relates to integrated semiconductor laser and laser amplifiers and, more particularly, to a method and apparatus for controlling the direction and focus of a laser beam by applying electric signals to an integrated semiconductor laser and laser amplifier.

2. Description of Prior Art

One of the oldest methods of directing and focusing lasers uses mechanical systems with a moving mirror or a moving lens i order to change the direction and focusing of a laser beam. The disadvantages of these systems are that they are very slow and very cumbersome. In recent years, various methods have been developed to deflect laser beams. The laser beam deflection methods include: use of a KDP crystal, use of the photoelastic effect, and by Bragg diffraction using acoustic waves. While these methods are much faster than mechanical deflection, they cannot be embodied into an integrated semiconductor laser device.

Development in the field of non-linear optics has also played a role in controlling the direction of a laser beam. Within the field of non-linear optics, a phase conjugate mirror has been developed. Using the phase conjugate mirror, the phase angle of a reflected wave can be made to conjugate that of the incoming wave. The reflected wave then retraces the path of the incident wave with a conjugated phase angle. Using this type of device, a laser with controllable beam direction can be developed. However, conjugate mirrors cannot be embodied into an integrated semiconductor laser device.

Each of the above laser direction and focusing control devices requires a complex optical system involving many precisely located components. To date, it has not been possible to direct and focus lasers using a simple single integrated semiconductor laser device. The present invention seeks to overcome the complexity of laser beam directing and focusing devices as well as provide a direction and focusing control which will operate much faster than the previously developed systems.

OBJECTS AND SUMMARY OF THE INVENTION

It is an object of the present invention to provide an integrated semiconductor laser device with electronic beam direction and focusing control of the laser beam.

It is another object of the present invention to provide an integrated semiconductor laser light amplifying device with electronically controlled direction of sensitivity and cone of sensitivity.

It is another object of the present invention to provide an integrated semiconductor laser and laser light amplifier with sufficiently fast electronic direction and focusing control to be able to create a laser optics open-air communication (LOOC) system.

It is yet a further object of the present invention to provide a laser optics open-air communication system which can be used on fast moving vehicles including cars and airplanes.

In accordance with the present invention, an extension chamber is added to the laser or laser light amplifier and made into an integral part thereof. The extension chamber may have one or more, or a whole array of active channels through which a laser light may pass. A control signal of electric currents are applied to the active channels of the extension chamber. These applied currents inject a minority carrier density distribution into the active channels to direct and focus the laser beam.

The speed of light in a semiconductor changes with the minority carrier density distribution within the semiconductor laser. This effect is used to shape the wave front of the laser beam in the extension chamber.

The integrated semiconductor laser device is no more than a few millimeters in size, and performs the functions of both a transmitter and receiver in an open-air laser optics communication system (LOOC). The time constants for electronic beam direction and focusing (cone angle) control of the integrated semiconductor laser device are in the order of nanoseconds. In the time scale of nanoseconds, fast moving vehicles are virtually at a standstill. Means are provided for transmitted laser beams from at least two terminals to automatically seek out each other, and to lock in communication at a high data rate.

BRIEF DESCRIPTION OF THE DRAWINGS

FIGS. 5(a)-(d) illustrate the various wave fronts which may be produced in accordance with the present invention.

FIG. 14 is a vertical cross-section view taken along lines 14—14 shown in FIG. 13.

DETAILED DESCRIPTION OF THE PREFERRED EMBODIMENTS

Figure 1:
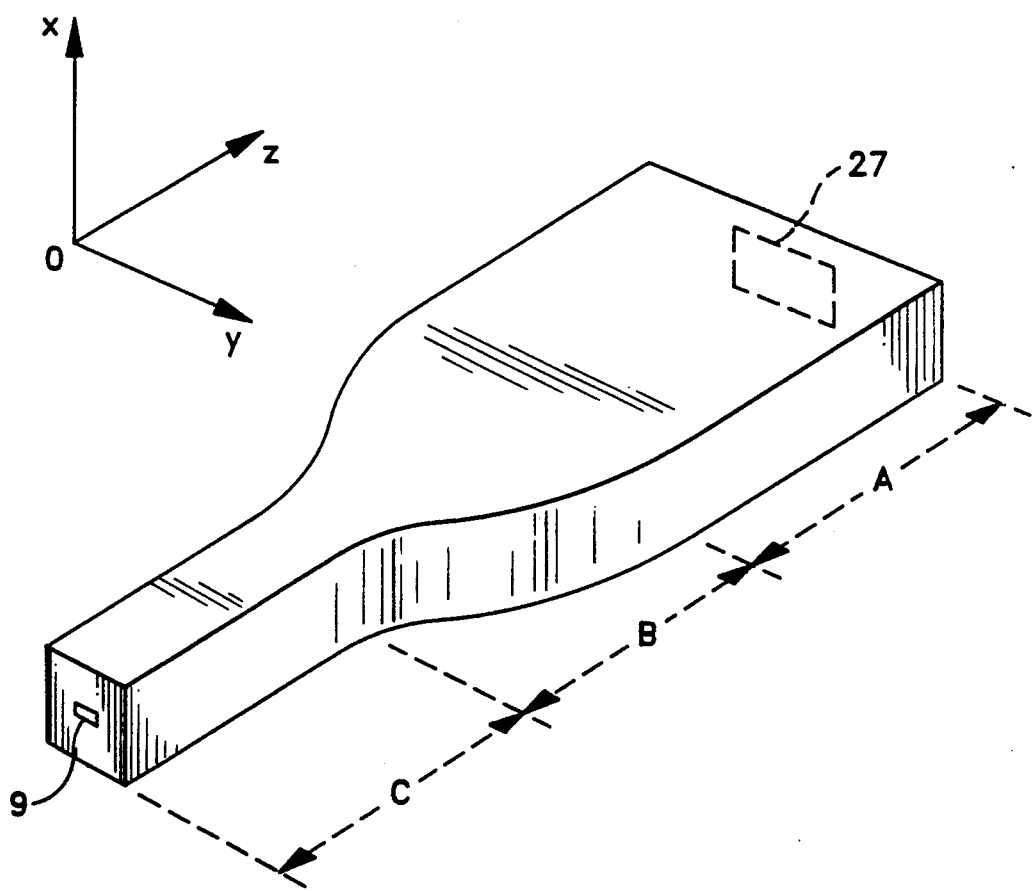
FIG. 1 is a perspective view of an integrated semiconductor laser device with beam direction and focusing control according to the present invention.
Figure 2:
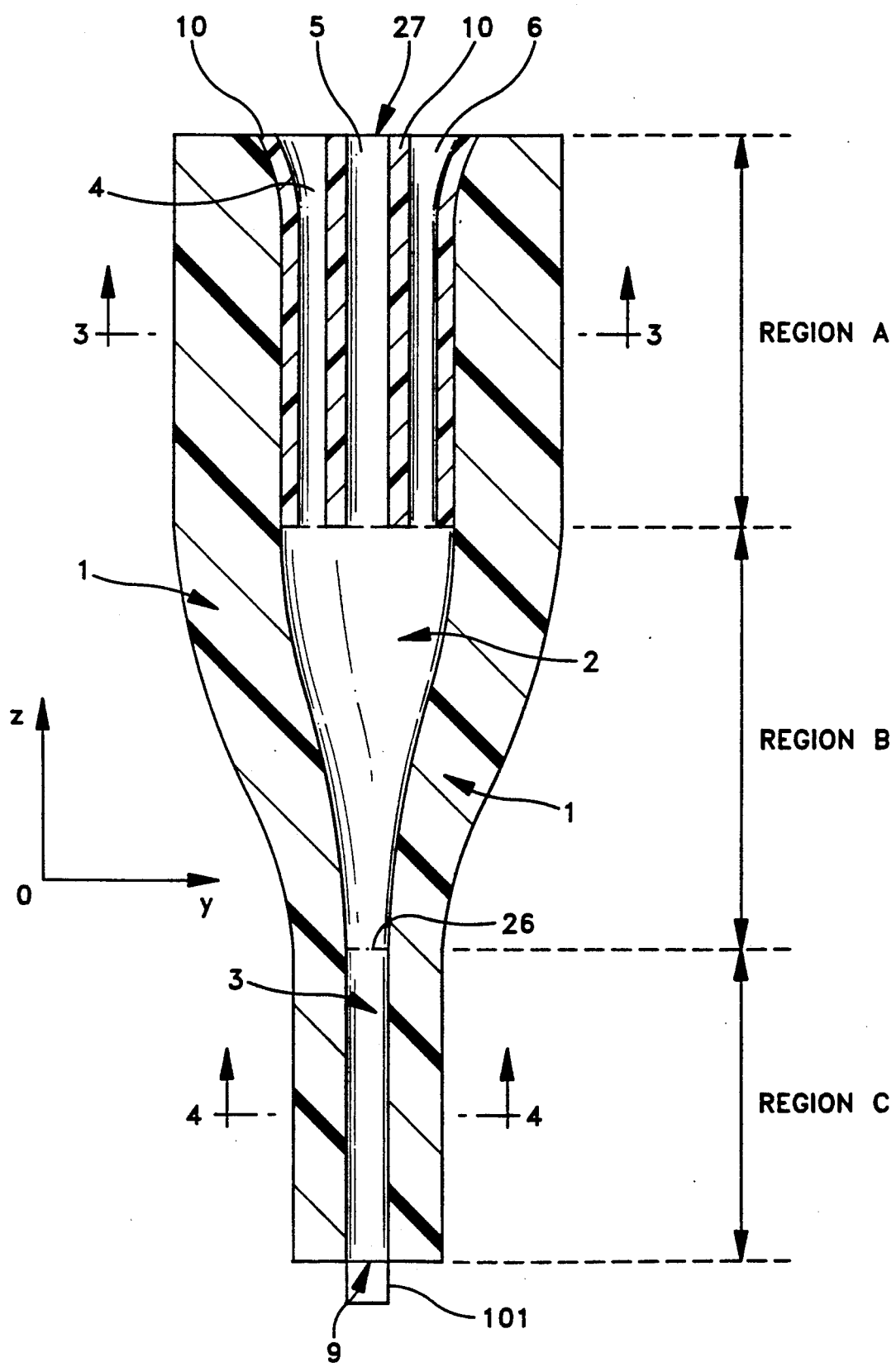
FIG. 2 is a horizontal cross-sectional view of the integrated semiconductor laser device shown in FIG. 1.

FIGS. 1 through 4 illustrate a first preferred embodiment of the present invention. The overall structure of the integrated semiconductor laser or laser amplifier may be described as a buried heterostructure (BH) laser having at least one active channel. The structure has a first end facet 9 at one end and a second end facet 27 at the opposite end. For a laser, the second end facet 27 is an output port. For a laser amplifier, the structure has end facets 9, 27 situated at the opposite axial ends of the laser amplifier. The light enters the structure at the second end facet 27 and the first end facet 9 is the output port. As shown in FIGS. 1 and 2, the internal structure has three regions: region A is an extension chamber which shapes a wave front; region B is a transition region; and region C is lasing section or resonant cavity for light generation (in the case of a laser), or for light amplification (in the case of a laser amplifier).

For a laser amplifier using any of the subsequent preferred embodiments, the first end facet 9 may be coupled directly to a photoelectric diode, such as a light detecting diode 101. The light detecting diode 101 converts the input light signals into a voltage signal for further processing. Alternatively, the first end facet 9 may be coupled to an optical fiber or some other optical transmission device.

A Cartesian coordinate system is used to define the various cross-sectional views of the preferred embodiments. Referring to FIG. 1, z is along the direction of light propagation, x is along the vertical direction and y is along the horizontal direction. A vertical cross-section is parallel to the x-y plane and perpendicular to the z-axis. A horizontal cross-section is parallel to the y-z plane and perpendicular to the x-axis. A longitudinal vertical cross-section is parallel to the x-z plane and perpendicular to the y-axis. The same reference coordinates are used in all figures.

Presently, there are two widely used semiconductor materials for BH lasers: either $Ga_{1-x}Al_xAs$ or $Ga_{1-y}In_yAs_{1-x}P_x$ where the subscripts x and y represent fractions of atoms in the crystal lattice. These materials have the following desirable properties:

(a) a lattice constant nearly independent of the fractions x and y; and (b) the index of refraction and energy gap of these materials vary with x and y in opposite ways (i.e. as x is reduced in magnitude, the index of refraction of the material is increased).

A lattice constant nearly independent of the fractions x and y is important for manufacturing. The properties of the materials regarding the index of refraction and energy gap are used to formulate the active channel and to direct and focus the laser beams of the present invention. For purposes of this description, a $Ga_{1-x}Al_xAs$ material is used, however, a $Ga_{1-y}In_yAs_{1-x}P_x$ material or any other material possessing the properties described in (a) and (b) above, can also be used.

Figure 3:
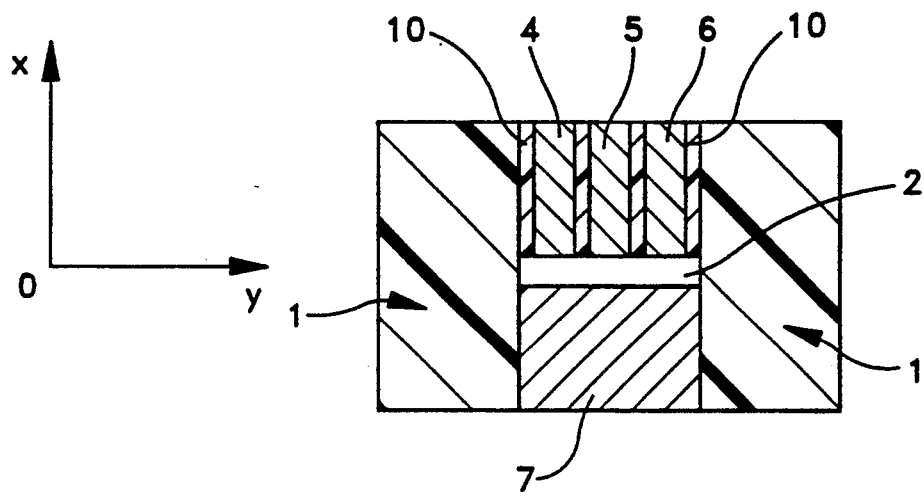
FIG. 3 is a vertical cross-sectional view of the extension chamber of the integrated semiconductor laser device taken along line 3—3 shown in FIG. 2.
Figure 4:
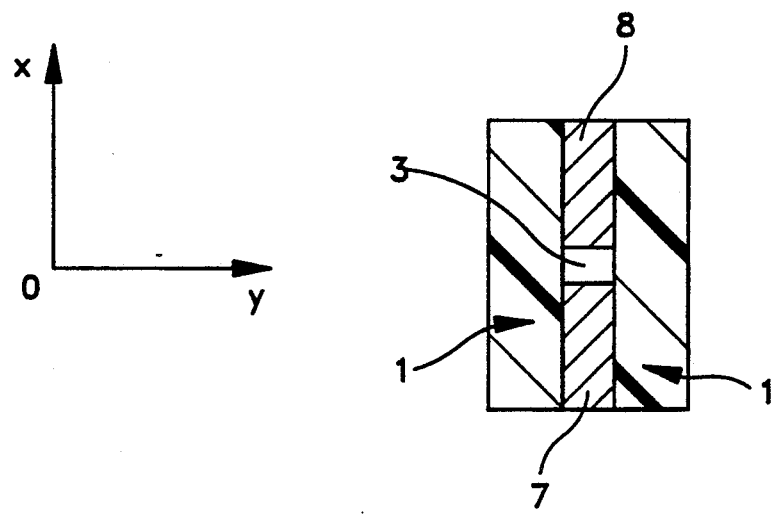
FIG. 4 is a vertical cross-sectional view of the laser proper of the integrated semiconductor laser device taken along line 4—4 shown in FIG. 2.

An integrated semiconductor laser having one dimensional direction and focusing control and formed in accordance with the present invention is illustrated in FIGS. 1 through 4. FIG. 2 is a horizontal cross-sectional view of the integrated semiconductor laser shown in FIG. 1. FIGS. 3 and 4 are vertical cross-sections taken along lines 3—3 and 4—4 shown in FIG. 2, respectively. Referring to FIG. 2, the integrated semiconductor laser structure has an active channel having two sections, one section represented by a numeral 2 in regions A and B, and the second section represented by numeral 3 in region C. The active channel 2, 3 is thin along the x-direction and can be described as a funnel-shaped slab.

Referring to FIGS. 3 and 4, the active channel 2,3 is bounded by a semiconductor material 1 on each side, a return semiconductor terminal represented by numeral 7 on the bottom and bounded on the top by semiconductor terminals represented by numerals 4, 5, 6, and 8. The return terminal 7 extends through regions A, B and C, and bounds the active channel 2,3 completely on the bottom. Terminal 8 bounds the active channel 3 completely on top in region C only. In region B, the active channel 2 is bound on the top by semiconductor material 1. In region A, the active channel 2 is bound on the top by semiconductor terminals, or electrode terminals 4, 5 and 6. Electrode terminals 4, 5 and 6 lie in parallel planes next to each other and are separated by an insulating material 10 which may be formed from an oxide. Electrode terminals 4 and 6 are also separated from the semiconductor material represented by numeral 1 by a similar insulating material 10. If a reverse biased diode is formed at the contact of terminals 4, 6 and 8 with material 1, no insulating material 10 is required at that junction. Therefore, all terminals 4, 5, 6, and 8 with the exception of return terminal 7 are insulated from material 1 either explicitly with an insulting material 10, or implicitly by forming a reverse biased diode.

The index of refraction of the material used in the first preferred embodiment, $Ga_{1-x}Al_xAs$, reduces as x is increased. The energy gap of the material increases as x is increased. In the preferred embodiment, the material composition used may preferably be as follows:

Table of material composition $Ga_{1-x}Al_xAs$

| Element Numeral | x-value | doping |
| --- | --- | --- |
| 1 | 0.4 | light n |
| 2 | 0.2 | 0 |
| 3 | 0 | |
| 4, 5, 6, 8 | 0.4 | heavily p |
| 7 | 0.4 | heavily n |

The above preferred x-values of crystal lattice and doping composition are for illustrative purposes only. In an actual application, the optimum choice or design depends on the application. For a laser, there is an abrupt change in x-value within the active channel 2,3 between regions B and C and the end facet 9 of the active channel is totally reflective.

The functioning of the improved laser or laser light amplifier of the present invention is based on two principles in physics:

(1) the speed of light in a semiconductor changes when the minority carrier density is changed; and (2) the direction and focal point of a laser light beam can be changed by changing the shape of the wave front of the light beam.

The first principle is known by laser researchers as a small but undesirable effect causing a shift in laser light frequency when the minority carrier density is changed. This effect by itself cannot be used for shaping a laser beam wave front if the active channel is made from only a single semiconductor material since the area of the wave front which is moved forward would also have a much higher intensity. However, there are two ways of changing the speed of light within a semiconductor without this effect:

(i) use a similar semiconductor material having a significantly larger energy gap for the active channel in the extension chamber (regions A) than that of the resonant cavity (region C). Since the energy gap is larger, the laser light cannot cause stimulated emission in the extension chamber. Therefore, the only effect caused by a change in minority carrier density is a change in the speed of light; and (ii) if the light frequency f generated by the laser is near the gap resonant frequency $f_o$ but not exactly equal to the resonant frequency, then minority carrier density will have two effects: (a) stimulated emission; and (b) increase or decrease the index of refraction depending on whether $f_o$-f is positive or negative.

Mathematically, the relationship can be expressed approximately as:

$$n = n_o + n_1 N \quad (1)$$

where n is the index of refraction, N is the minority carrier density, and $n_1$ is a coefficient.

Equation (1) applies to both cases (i) and (ii) above for changing the speed of the light beam. It can be explained as follows: The energy E of a single photon is related to a photon's light frequency f by Planck's equation:

$$E = hf \quad (2)$$

where h is known as Planck's constant. The energy gap between the conduction band and the valence band of a semiconductor is denoted as $E_g$. Its resonant frequency $f_o$ is related to $E_g$ by the equation:

$$E_g = hf_o \quad (3)$$

When the extension chamber (region A) is formed of semiconductor material having a significantly higher energy gap than that of the resonant cavity (region C), the magnitude of E is much less than $E_g$. A photon cannot be absorbed because it does not have sufficient energy to raise an electron from the valence band to the conduction band. Since the photon's light frequency f is very different from its resonant frequency $f_o$, there is substantially no stimulated emission. The minority carrier particles behave like free charged particles reducing the index of refraction. Referring to equation (1), $n_1$ would be negative.

Also, the speed of light in a semiconductor $C_{sc}$ is inversely proportional to its index of refraction:

$$C_{sc} = \frac{c}{n} \quad (4)$$

where c is the speed of light in a vacuum.

Since the x-value in the active channel 2,3 is zero or lower than the x-value for the semiconductor material bounding the active channel, the active channel 2, 3 forms a cavity bounded by materials having a lower index of refraction. The semiconductor material 1 bounding the cavity formed by the active channel 2,3 may have a varying x-value. However, the x-value must be greater than the x-value of the cavity everywhere along the cavity boundary. The four walls of the cavity are totally reflective with respect to a light wave along the z-direction. To begin laser action, a positive current is applied to terminal 8 with return terminal 7 being grounded. Laser action begins in the active channel 3 when the current applied to terminal 8 is raised above a threshold value for the semiconductor material causing stimulated emission in the active channel 3. The stimulated emission or laser light is transmitted through the active channel internal port 26 which is situated between regions C and B in the active channel and into the active channel 2, in regions B and A. The emitted laser light has a frequency, f:

$$f = \frac{E_{g(C)}}{h}$$

where $E_{g(C)}$ is the energy gap of the active channel 2 in region C. In the active channel 2, the energy gap in regions A and B, $E_{g(AB)}$ is larger than $E_{g(C)}$:

$$E_{g(AB)} > E_{g(C)}$$

Consequently, the light photons cannot induce stimulated emission. The only effect of free electrons in the active channel 2 is a reduction in the index of refraction or an increase in speed of light $C_{sc}$.

The control of the laser light beam direction or focusing is done by shaping the wave front of the light beam. FIGS. 5(a)-(d) illustrate the wave front shaping which may be accomplished using an integrated semiconductor laser of the present invention. The wave front is shaped by changing the minority carrier density distribution in the active channel 2 of the extension chamber, region A. The minority carrier density is changed by applying electrical current to each of the electrode terminals 4, 5 and 6. Let these currents be denoted as $I_4$, $I_5$, and $I_6$ respectively. Referring to FIG. 5(a), to direct the light beam to the right in the y direction, a current is applied to the terminals 4, 5 and 6 so that $I_4$ is greater than $I_5$, and $I_5$ is greater than $I_6$.

The applied currents cause an increase in the minority carrier density in the active channel 2 of the extension chamber region A, which is greater under terminal 4 than under terminals 5 and 6. Consequently, the wave front of the laser beam travels fastest on the left (under terminal 4), resulting in a tilting of the wave front towards the right side of the active channel 2 in the extension chamber. A succession of wave fronts 201, 202 and 203 in the active channel 2 of the extension chamber are illustrated in FIG. 5(a). At the output end facet 27 of the extension chamber, the direction of the light beam is shown by the arrow 205. Since the index of refraction of the extension chamber is much greater than that of free air, the speed of light is proportionally faster in free air. The wave front which emerges from end facet 27 into free air is shown by broken line 204 and the direction of the laser light beam in free air is shown by broken line arrow 206. The laser light beam is, therefore, directed to the right in the y-direction.

Similarly, a current distribution with $I_4$ less than $I_5$, and $I_5$ less than $I_6$ produces a wave front directed towards the left in the y-direction as shown in FIG. 5(b). The wave front within the active channel 2 of the extension chamber is shown by broken line 210 and the wave front once it reaches free air is shown by broken line 211. The direction of the light beam in free air is shown by broken line arrow 212.

FIG. 5(c) illustrates a wave front in which the lightwave propagates at a slower rate in the center of the active channel 2 of the extension chamber, region A. This wave front is accomplished by applying a current to electrode terminals 4, 5 and 6 so that current $I_4$ is greater than $I_5$ and $I_4$ and $I_6$ are equal in magnitude. The wave front 207 produced in the active channel 2 of the extension chamber is slightly concave. Since the wave front moves faster in free air, and the two sides of the wave front reach the output end facet 207 first, the curvature is increased. The wave front in free air is shown as broken line 208. This shape of wave front produces an actual focal point 209 of the laser light beam.

FIG. 5(d) illustrates a wave front in which the lightwave propagates at a faster rate in the center of the active channel 2 of the extension chamber, region A. This wave front is accomplished by applying a current to electrode terminals 4, 5 and 6 so that current $I_4$ is less than $I_5$ and the magnitude of $I_4$ is equal to $I_6$. The wave front 213 produced in the active channel 2 of the extension chamber is slightly convex since the minority carrier density in the center will be greater, causing an increase in the speed of light in the center of the active channel 2. The wave front 214 produces a virtual focus 215 within the extension chamber. The various current distributions illustrated in FIGS. 5(a)-(d) may be combined linearly to control both the direction and the focal point of a laser light beam.

The same integrated semiconductor laser device may be used for controlled directing and focusing of a laser light amplifier. For a laser light amplifier the laser light is input at end facet 27. The output of the laser amplifier is through end facet 9 which may be coupled to a photoelectric diode such as a light detecting diode 101 or some other device for further optical processing. The active channel 2 of the extension chamber, region A, is used as previously described to control the direction of sensitivity and cone of sensitivity corresponding to beam direction and focusing, respectively. Based on a well known reciprocity relationship, the extension chamber which provides beam direction and focusing for a laser, can provide direction of sensitivity and cone of sensitivity for a laser light amplifier.

In a laser light amplifier, the resonant cavity, region C is used for amplifying the light beam. Either a travelling wave amplifier (TWA), a Fabry Perot amplifier (FPA) or pulsed versions of the above can be used. If a TWA is used, the change in composition in the active channel 2, 3 between the resonant cavity, region C, and transition region, region B, is preferably gradual and the two end facets 9,27 are preferably coated to reduce reflectivity. If an FPA or a pulsed FPA is used, the change in composition in the active channel 2,3 between the resonant cavity, region C, and the transition region, region B, may be abrupt to provide the needed reflectivity.

FIGS. 2, 3 and 4 illustrate an integrated semiconductor laser or laser amplifier device formed in accordance with the present invention and having three direction and focusing control electrode terminals 4, 5 and 6 to illustrate the principle of operation. A larger number of such electrodes may be used to attain a higher degree of control of the minority carrier density distribution within the active channel 2 of the extension chamber, region A.

Figure 6:
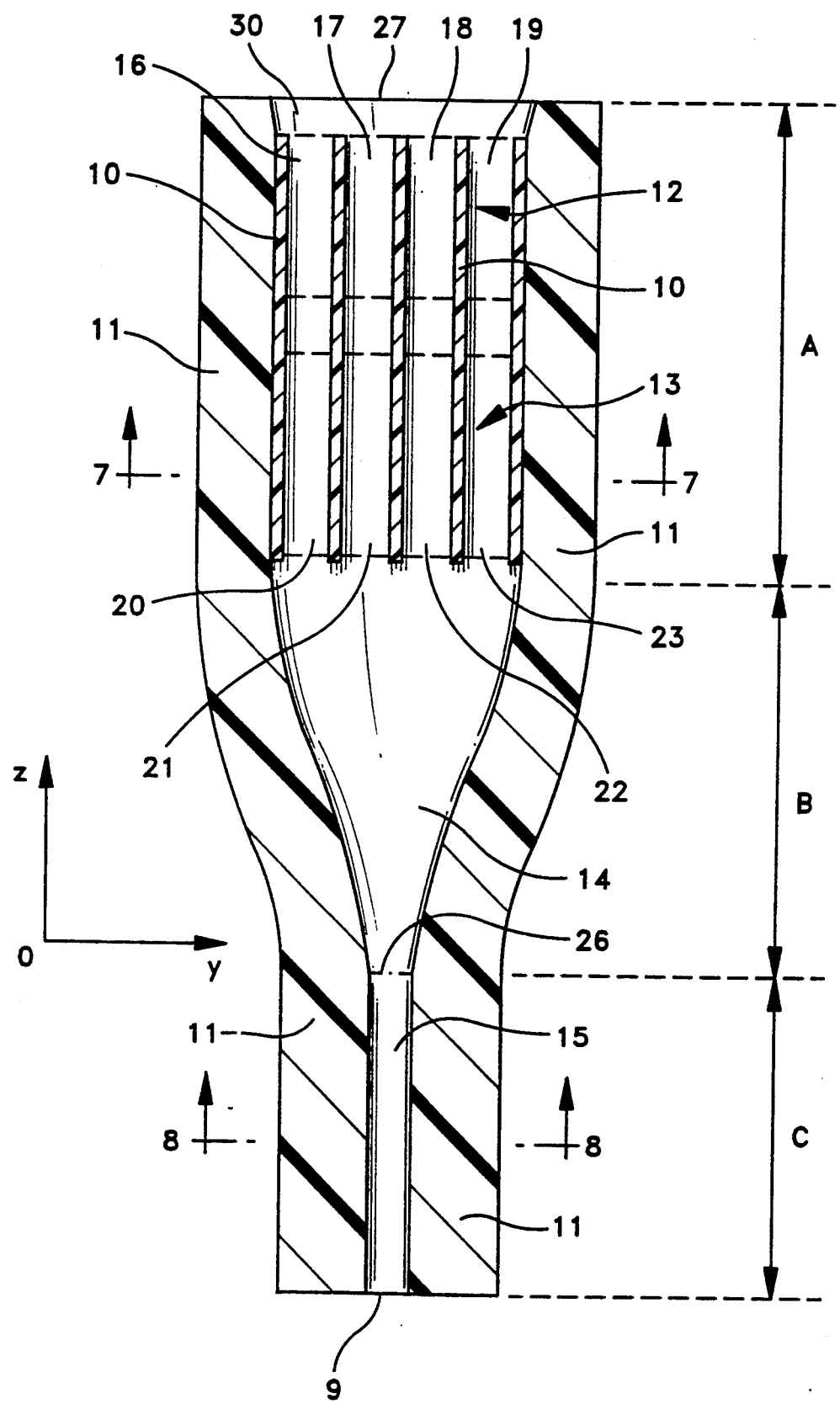
FIG. 6 is a horizontal cross-sectional view of a second preferred embodiment of an integrated semiconductor laser device having isolated active channels in the extension chamber.
Figure 7:
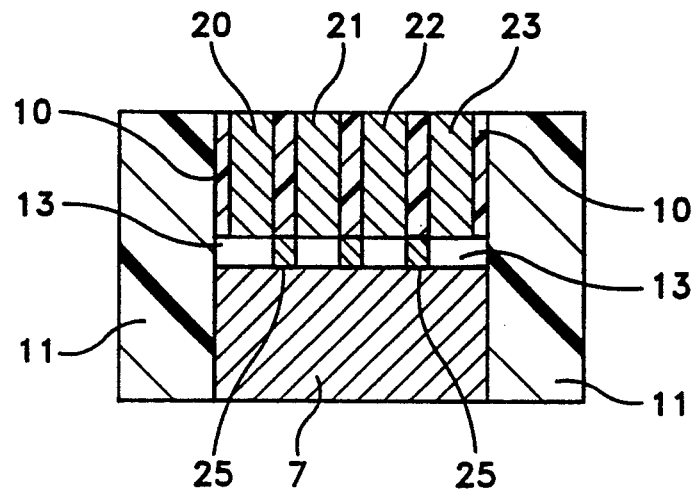
FIG. 7 is a vertical cross-section view taken along line 7—7 shown in FIG. 6.
Figure 8:
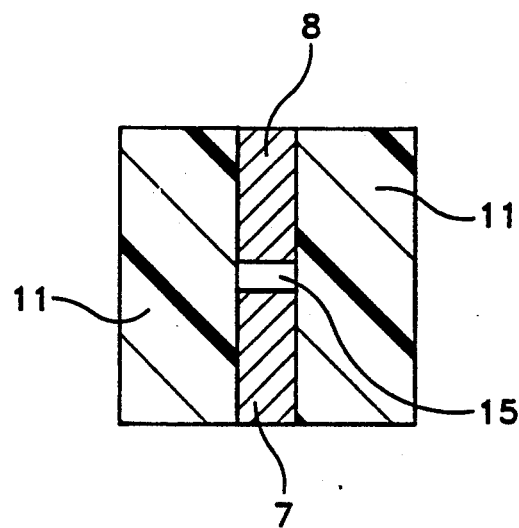
FIG. 8 is a vertical cross-section taken along line 8—8 shown in FIG. 6.

FIGS. 6, 7 and 8 illustrate a second preferred embodiment of the present invention. The output light from laser resonant cavity 15 exits the laser output port 26 and is expanded outwards in the transition cavity 14 and continues into the extension chamber, region A, the extension chamber active channel being heterogeneous in material composition. The extension chamber, region A, may be partitioned into a plurality of sections, the preferred embodiment has two sections, a phase control cavity 13 and a gain control cavity 12 adjacent to and in communication with the phase control cavity 13. Referring to FIG. 7, the active channel of the extension chamber is partitioned longitudinally into a plurality of parallel active channel sections, arranged side-by-side, having light insulators 25 interposed between and separating adjacent active channel sections. The light insulators 25 may comprise a different material from insulating material 10. The light insulators 25 are preferably formed of the same semiconductor material as the active channel 2,3, except having a higher x-value.

Referring to FIG. 7, the phase control cavity 13 is bounded on the top by semiconductor electrode terminals 20, 21, 22, and 23 and is bounded on the bottom by return electrode terminal 7. The electrode terminals 20, 21, 22 and 23 reside parallel to each other and adjacent terminals are separated by an insulating material 10, such as an oxide. Electrode terminals 20 and 23 are separated from bounding semiconductor material 11 by an insulating material 10. Bounding semiconductor material 11 comprises a material having an x-value larger than the x-value of the phase control cavity active channel 13. The phase control cavity 13, electrodes 20 and 23, and return terminal 7 are bounded by semiconductor material 11 on each side as shown in FIG. 7.

A cross-section of the gain control cavity 12 is similar in structure to the phase control cavity 13. The active channel of the gain control cavity 12 is partitioned longitudinally into a plurality of parallel active channel sections having light insulators 25 separating each active channel section. Each active channel section in the gain control cavity is bounded on the top by an electrode semiconductor terminal 16, 17, 18, and 19. Gain control cavity 12 is bounded on the bottom by a return electrode terminal 7 and on each side by a semiconductor material 11 having an x-value larger than the x-value of the gain control cavity active channel 12. Since the active channel sections of the phase control cavity 13 and gain control cavity 12 are separated by light insulators 25, each active channel section is optically isolated from the rest. The significance of this will be discussed subsequently.

FIG. 8 is a cross-section view of the integrated semiconductor laser structure of FIG. 6 taken along line 8—8 as shown in FIG. 6. The resonant cavity 15 is bounded on the top by electrode terminal 8 and on the bottom by return electrode terminal 7. Semiconductor material 11 having an x-value larger than the x-value of the resonant cavity 15 bounds the electrode terminals 8, 7 and the resonant cavity 15 on each side.

Referring to FIG. 6, the active channel for the laser or laser amplifier is made from materials 12, 13, 14 and 15 which form a single funnel shaped slab. The material composition of the active channel may be different in each enumerated section. A typical integrated semiconductor laser device in accordance with the present invention may have an active channel made from $Ga_{1-x}Al_xAs$ where the x-values are 0 for the resonant cavity 15 and gain control cavity 12 and are 0.2 in the transition cavity 14 and the phase control cavity 13. The electrode terminals 16–23 may be comprised of the same semiconductor materials as the electrode terminals described in the first preferred embodiment. Also, return terminal 7 and electrode terminal 8 may be the same materials as described in the first preferred embodiment shown in FIG. 2.

The energy gap in the gain control cavity 12 is the same as that of the resonant cavity 15 and gives rise to stimulated emission or laser action. The energy gap in the phase control cavity 13 and transition cavity 14 is greater than that of the resonant cavity 15 and gain control cavity 12 so that an increase in the minority carrier density will only change the index of refraction and not cause stimulated emission in these sections 13, 14. The active channel sections in the gain control cavity 12 are used to increase the total output power of the preferred embodiment. The gain control cavity 12 also may be used to compensate for any uneven power loss which may occur in the phase control cavity 13.

As shown in FIG. 6 there is preferably a mixing area 30 positioned between the outputs of the active channel section of the gain control cavity 12 and the end facet 27. The mixing area 30 may be formed from a material having approximately the same index of refraction as the gain control cavity 12. In the mixing area 30, the light from each active channel section is combined before exiting the end facet 27. The mixing area 30 expands the active channel in thickness as well as gradually expanding outwards to form a funnel shape. The mixing area 30 is bounded on the bottom by return terminal 7, on the sides by semiconductor material 11 and on the top by a semiconductor material, such as that represented by numeral 11, so that the formation of a cavity is maintained. The mixing area 30 may be either integrated into the semiconductor device or separately attached, depending upon ease of manufacture.

The second preferred embodiment illustrated in FIG. 6 operates in the same manner as the first preferred embodiment illustrated in FIG. 2. For a laser, electric current is applied to electrode terminal 8 thereby injecting minority carriers into the resonant cavity 15 of the active channel causing stimulated emission within the active channel. The stimulated emission or laser light continues within the active channel into the transition region 14 and then into the extension chamber 12, 13. In the extension chamber 12, 13, the laser light is separated by light insulators 25 into a plurality of beams within a plurality of active channel sections to enhance the control of the device to direct and focus the laser light beam.

In the phase control cavity 13 the energy gap is larger than that of the resonant cavity 15. Therefore, minority carriers injected into this region by electrode terminals 20, 21, 22 and 23 only affect the index of refraction. As previously described in the first preferred embodiment shown in FIG. 2, the wave front may be shaped by applying various currents to the electrode terminals 20, 21, 22 and 23.

In the gain control cavity 12 of the extension chamber, the energy gap is approximately the same as that of the resonant cavity 15. This allows minority carriers injected by currents applied to electrode terminals 16, 17, 18 and 19 to cause stimulated emission and increase the output power of the second preferred embodiment. These applied currents also control the light intensity profile at end facet 27.

The second preferred embodiment illustrated in FIGS. 6, 7 and 8 may also be used as a laser light amplifier having directivity. The active channel sections in the gain control cavity 12 operate as pre-amplifiers for an incoming signal which is received at end facet 27. The active channel sections of the phase control cavity 13 determine the focal distance and direction of the input laser light source. By applying current to electrode terminals 20 through 23, the phase control cavity 13 may be controlled to create a sensitive zone from which a laser light beam from an external source arrives at end facet 9 in phase. The resonant cavity provides final amplification of the combined laser light beam.

As previously noted, the second preferred embodiment of FIG. 6 has the advantage of using optically isolated active channel sections in the extension chamber to obtain a larger angle of deflection while applying limited currents to the electrode terminals. When the required change in wave front in any active channel section is more than one wavelength, the amount that actually need be changed is the fraction over the integer number of wavelengths. Such a minimal change maintains the correct phase relationship at the output end of the active channel sections. It can be proven mathematically that correct phase relationship is all that is necessary to provide the desired directivity and focusing.

Figure 9:
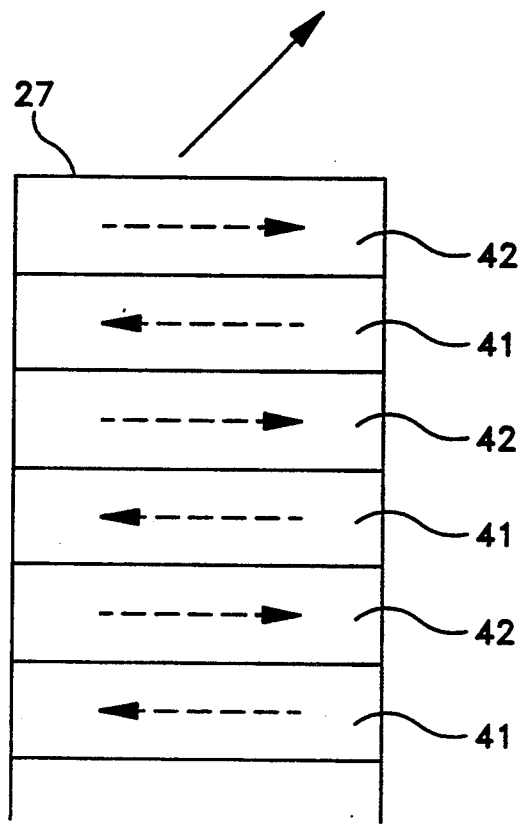
FIG. 9 is an illustration of an active channel of a third preferred embodiment of an integrated semiconductor laser device for one dimensional directing focusing control.

A third preferred embodiment of the present invention is shown in FIGS. 9–12. The illustrated third preferred embodiment differs from the first and second preferred embodiments only in its active channel structure within the extension chamber. Referring to FIG. 9, the active channel of the extension chamber includes a plurality of horizontal segments comprising two semiconductor materials 41, 42 having gap resonant frequencies such that the index of refraction coefficient $n_1$ for each material has a different sign.

Figure 10:
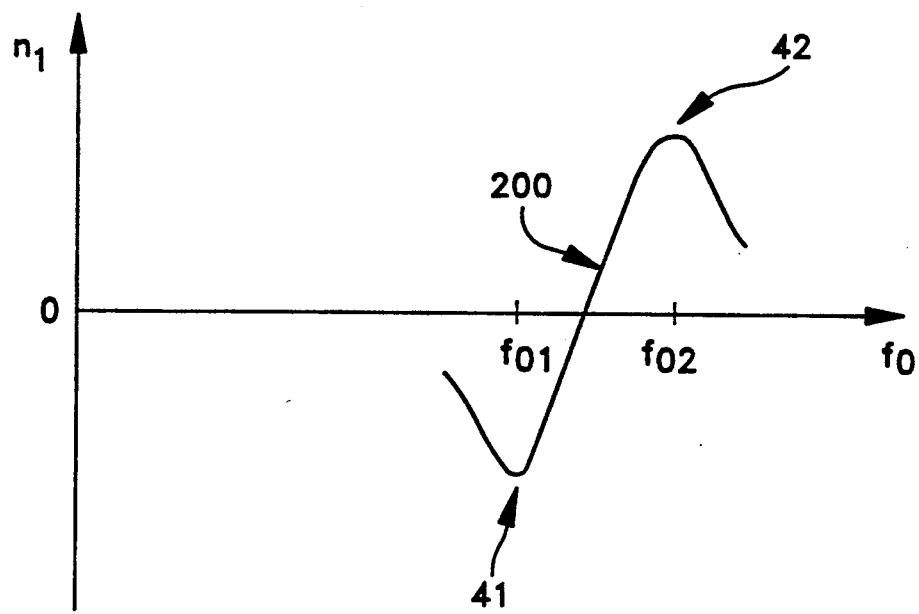
FIG. 10 is a plot illustrating the relationship between the index of refraction and energy gap of various semiconductor materials used in the third preferred embodiment.

As shown in FIG. 10, the first extension chamber semiconductor material 41 has a negative coefficient, $n_1$, and the second extension chamber material 42 has a positive coefficient, $n_1$, with respect to equation (1). FIG. 10 illustrates a curve 200 which plots the index of refraction coefficient $n_1$, against the semiconductor material gap resonant frequency $f_0$.

Using the material $Ga_{1-x}Al_xAs$ as an illustration, the active channel semiconductor material 41 may preferably have an x-value equal to 0, the x-value for the laser resonant cavity material 15 may preferably be $x = \epsilon_1$, and the x-value for the active channel semiconductor material 42 may preferably be $x = \epsilon_2$, such that 0 is less than $\epsilon_1$ which is less than $\epsilon_2$. The values $\epsilon_1$ and $\epsilon_2$ are variables and are selected so that the index of refraction coefficient $n_1$, will be at its negative peak for the extension chamber material 41 and at a positive peak for active channel extension chamber material 42.

As previously noted, the speed of light in a semiconductor $C_{sc}$ is inversely proportional to its index of refraction n:

$$C_{sc} = \frac{c}{n}$$

where c is the speed of light in a vacuum. Therefore, the speed of light will increase with an increase in the minority carrier density, N, for the active channel extension chamber material 41 and, conversely, will decrease with the increase in minority carrier density, N, for active channel extension chamber material 42.

Referring to FIG. 9, the minority carrier density, N, increases in the direction of the arrows shown in each segment of the active channel extension chamber. Since the active channel extension chamber materials 41, 42 have a different sign with respect to their index of refraction, the light beam will travel faster at the left side of the active channel extension chamber than at the right side. Therefore, the wave front of a light beam which exits the end facet 27 will exit at an acute angle with respect to the end facet 27 surface, thereby directing the light beam towards the right. By varying the minority carrier density distributions, both the light beam direction and focal point of the light beam may be controlled.

Figure 11:
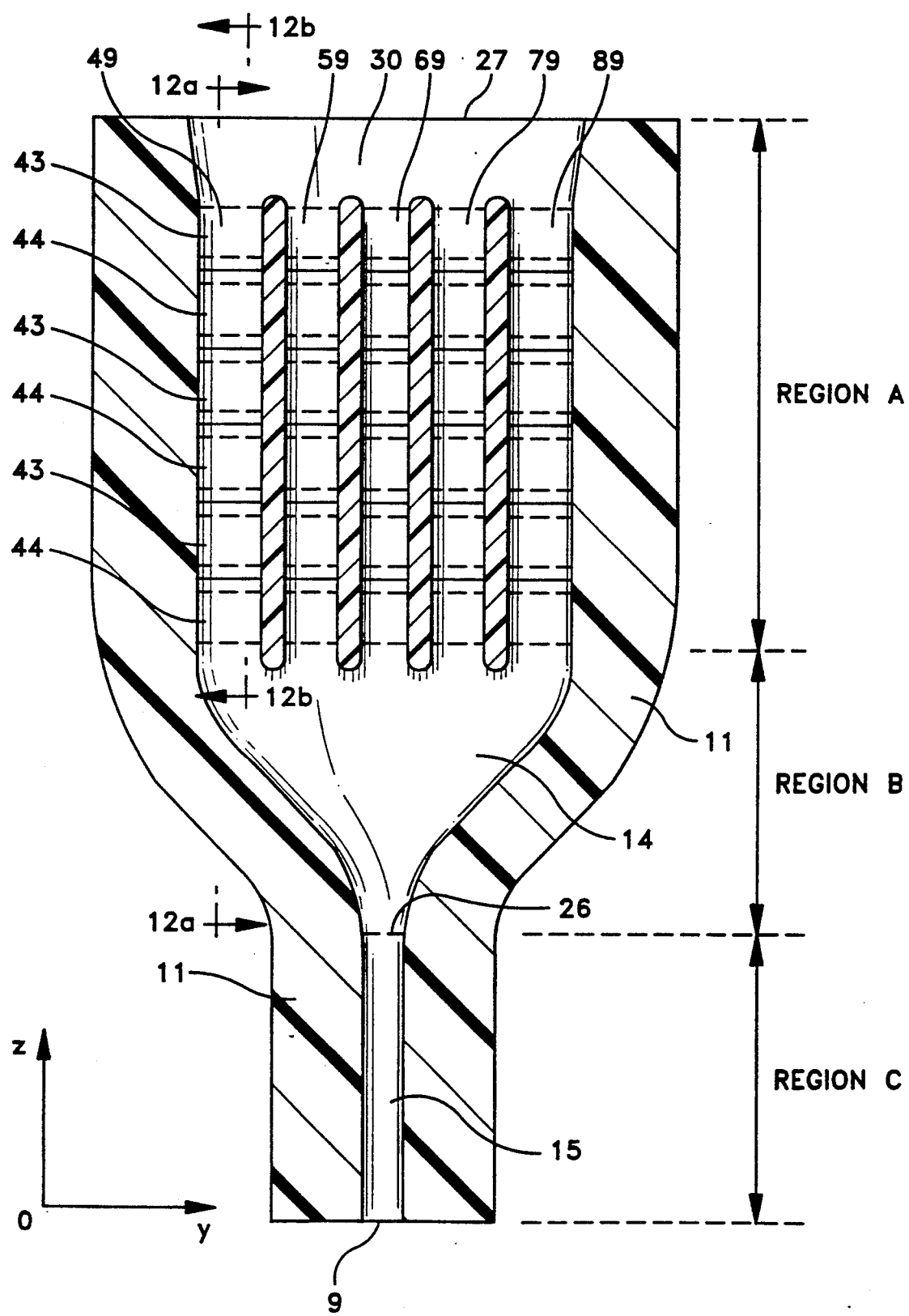
FIG. 11 is a horizontal cross-section view of the third preferred embodiment of the present invention.

FIGS. 11 and 12 illustrate the active channel and electrode arrangements used to vary the minority carrier density distributions for the third preferred embodiment of the present invention. FIG. 11 is a horizontal cross-section view of the third embodiment of the present invention. The structure of the third embodiment is similar to that of the second embodiment shown in FIG. 6 except for the extension chamber, region A. Referring to FIG. 11, in the extension chamber, the segmented active channel is separated into a plurality of active channel sections 49, 59, 69, 79, 89 arranged side-by-side in parallel, with adjacent channel sections being separated by a light insulating material (not shown). The active channel sections 49, 59, 69, 79, 89 are perpendicular to the active channel extension chamber segments comprising the materials 41 and 42 as shown in FIG. 9. Thus, each separated active channel section comprises alternate segments of active channel extension chamber materials 41 and 42. Each separated active channel section 49, 59, 69, 79, and 89 has a similar structure. Therefore, the structure of active channel section 49 is illustrative of each active channel section in the third embodiment of the present invention as shown in FIG. 11.

Figure 12A:
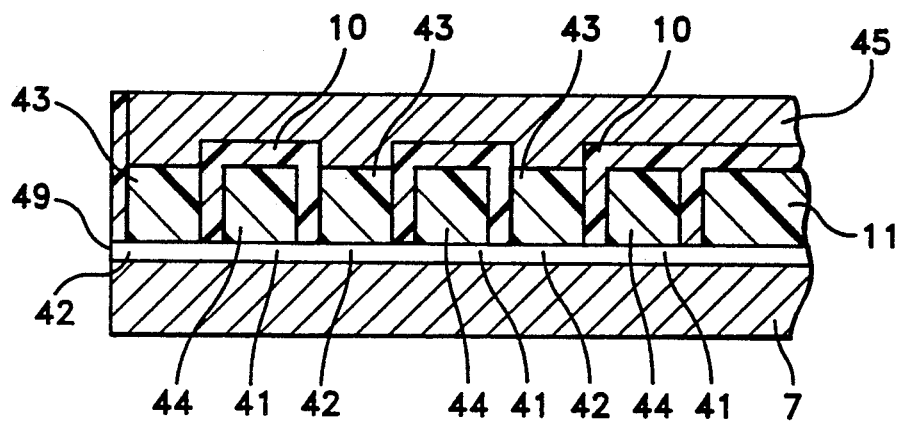
FIGS. 12(a)-(b) are vertical cross-section views taken along lines 12a-12a and 12b-12b shown in FIG. 11 respectively.
Figure 12B:
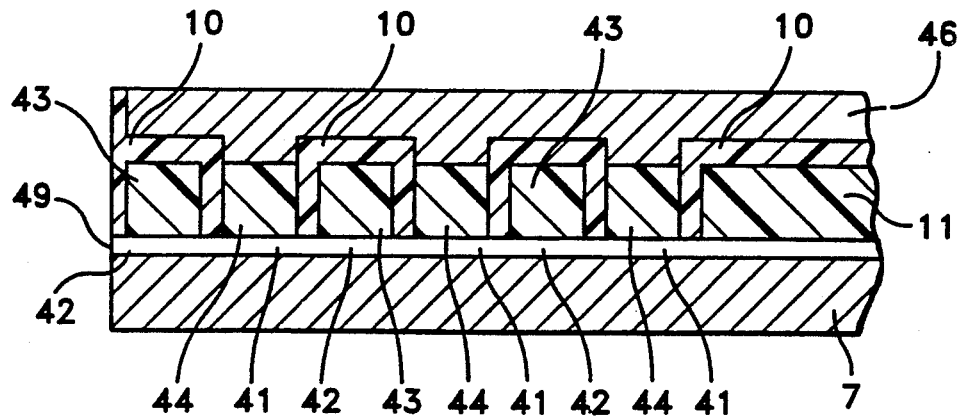

Referring to FIGS. 12(a)-(b), the active channel section 49 is bounded on the bottom by return terminal electrode 7 and is bounded on the top by a plurality of alternating semiconductor contacts 43, 44 which are separated from each other by an insulating material 10. The contacts 43, 44 are bounded on the top by two semiconductor electrode terminals 45, 46 such that electrode terminal 45 is connected to the contacts represented by numeral 43 only and is separated from the contacts represented by numeral 44 by an insulating material 10. Conversely, electrode 46 is connected to contacts represented by numeral 44 only and is insulated from the contacts 43 by insulating material 10. Therefore, any electric current imposed by electrode 45 is distributed uniformly through the plurality of contacts 43 to the active channel section 49 which comprises active channel extension chamber material 42. Similarly, electric current imposed on electrode 46 is distributed uniformly through the plurality of contact 44 to the segment of active channel section 49 comprising the active channel extension chamber material 41. Identical electrodes are placed along each of the active channel sections 59, 69, 79, and 89 and operate in the same manner.

The integrated semiconductor laser of the present invention shown in FIG. 11 directs and focuses a light beam by imposing electric currents on electrodes 45 and 46. For example, let $I_{45}$ and $I_{46}$ denote the electric currents applied to electrodes 45 and 46 respectively. An increase in the average current $I_a$ of $I_{45}$ and $I_{46}$ will cause an increase in the intensity of the light beam passing through active channel section 49:

$$I_a = \tfrac{1}{2}(I_{45} + I_{46})$$

An increase in the differential current $I_d$ causes an increase in the speed of the light beam within the active channel section 49:

$$I_d = \tfrac{1}{2}(I_{46} - I_{45})$$

Thus, the effect of $I_a$ corresponds to the effect of the gain control cavity previously described in FIG. 6. The effect of $I_d$ corresponds to the effect of the phase control cavity as previously described with respect to the embodiment shown in FIG. 6.

The third preferred embodiment shown in FIG. 11 operates at maximum efficiency by making the change in material composition between active channel extension chamber segments 41, 42 a gradual change. Also, segment widths of integer wavelengths should be avoided so that any reflected light waves between the segments 41, 42 do not add in phase.

Figure 13:
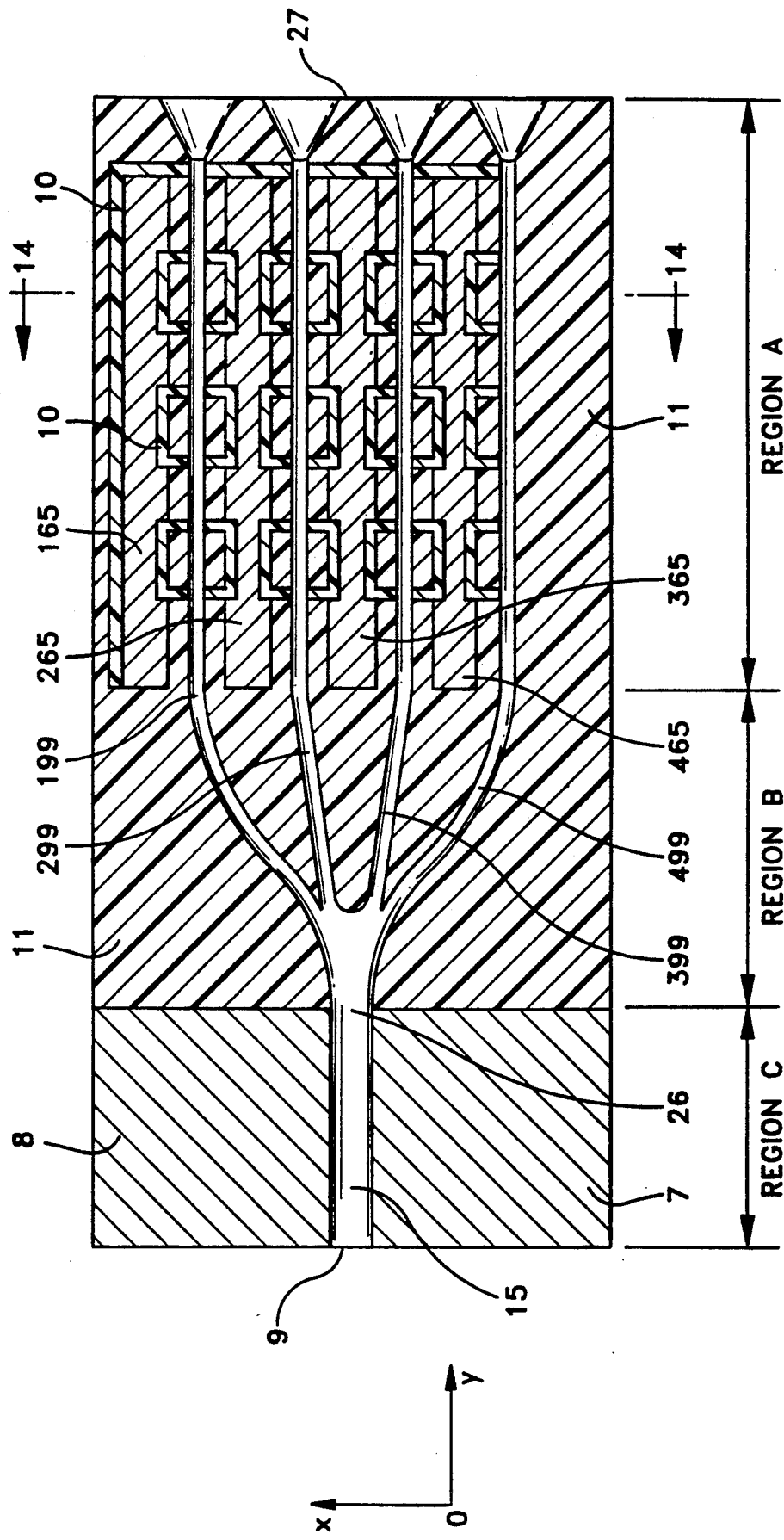
FIG. 13 is a longitudinal vertical cross-section view of an integrated semiconductor laser formed in accordance with the present invention with two dimensional laser beam direction and focusing control.

FIGS. 13 and 14 illustrate a fourth embodiment of the present invention. The fourth embodiment relates to an integrated semiconductor laser or laser amplifier having two dimensional light beam direction and focusing control. Referring to FIG. 13, regions A, B and C correspond to a two dimensional extension chamber, a two dimensional transition cavity, and a laser or a laser amplifier, respectively. FIG. 13 is a longitudinal vertical cross-section view of the two dimensional device of the present invention which is slightly off center to illustrate one set of a plurality of electrodes 165, 265, 365, and 465.

Referring to FIG. 13, the laser or laser amplifier region, region C, has a resonant cavity 15 bounded on the top by positive terminal 8, on the bottom by return terminal electrode 7 and on each side by semiconductor material 11. The resonant cavity 15 has an end facet 9 at one end and an internal port 26, at the other end leading into the transition cavity, region B. At the internal port 26, the resonant cavity is branched into a plurality of active channels 199, 299, 399, and 499 which become parallel and spaced apart from each other in the extension chamber, region A. Each active channel of the fourth embodiment of the present invention is identical in structure and may be made from either the structure shown in FIG. 2, region A; FIG. 6, region A; or FIG. 11, region A. For the embodiment shown in FIG. 13, the structure for each active channel in the extension chamber has been selected to correspond to the structure as illustrated in FIG. 11, region A.

FIG. 14 is a vertical cross-section taken along lines 14—14 as shown in FIG. 13. Each active channel in the transition region 199, 299, 399 and 499 is further separated into a plurality of active channel sections within the extension chamber, region A, by a light insulating material 25. For example, active channel 199 is further separated into smaller active channel sections 149, 159, 169, 179 and 189 as illustrated in FIG. 14. As previously described for the third embodiment of the present invention, each active channel section 149, 159, 169, 179 and 189 has two groups of segments, each segment comprising a semiconductor material having the characteristics as previously described in FIG. 9 for the materials 41 and 42. The structure of the extension chamber as illustrated in FIG. 14 can be described as a plurality of common active channel structures stacked one above the other to form a two dimensional array. Therefore, only the structure comprising the active channel section 169, electrodes 165, 166 and contacts 163, 164 will be described in detail.

The active channel section 169 is similar in structure to the active channel section 49 as shown in FIGS. 11 and 12. Two groups of contacts 163 (not shown) and 164 are spaced along the z-direction alternately similar to the contacts 43 and 44 as shown in FIGS. 11 and 12. The contacts 164 are positioned above the active channel section 169. The electrodes 165, 166 are positioned above the contact 164 such that electrode 166 is connected to the contacts 164 and electrode 165 is insulated from the contacts 164. Conversely, electrode 165 is connected to the contacts 163 and electrode 166 is insulated from the contacts 163. Electrode 166 is connected to 164 to inject minority carriers into the active channel section 169. The active channel 169 is bounded on the bottom by return electrode terminal 7. Alternatively, active channel section 169 may be bounded on the bottom by contacts 263 (not shown) and 264 as shown in FIG. 11.

The active channel arrangement as described above constitutes one block in an array of blocks which form the extension chamber of the fourth embodiment of the present invention. The extension chamber is bounded on the bottom by return terminal 7 and on each side and on the top by semiconductor material 11 having an x-value as previously described in reference to FIG. 6.

Referring to FIG. 13, the end facet 27 is preferably slightly spherical so that the distance the light must travel from the internal port 26 to any point on the end facet 27 will be equal. Also, the ends of the active channel sections near the end facet 27 preferably gradually expand so that the entire end facet 27 is formed from a plurality of active channel section ends.

The integrated semiconductor laser having two dimensional direction and focusing control operates similar to the first, second and third preferred embodiments of the present invention. For example, for a laser device, the laser beam is generated in the resonant cavity 15 and separated into a plurality of active channels 199, 299, 399 and 499 in the transition region. When the laser light beam enters the extension chamber, region A, electric currents may be selectively applied to the various electrodes of the extension chamber thereby changing the minority carrier density within a given active channel section. As the minority carrier density is changed, either the light intensity or the speed of light and subsequently the wave front which exits the end facet 27 may be changed. Therefore, by selectively applying electric currents to the electrodes of the device, the laser light beam may be directed and focused two dimensionally. For example, currents may be applied to the electrodes to direct the laser light beam both down and to the right.

A limitation on integrated circuits and integrated opto-electronic devices is the number of terminals or contacts which are brought out from the device. The device cost rises sharply if a large number of contacts exist. For this reason, an integrated circuit component may be included as an integral part of the preferred embodiment of the present invention. The external contacts of the present invention include ground, power supply, signals for deflection angles, cone angles, intensity, intensity profiles, major and minor axes for elliptic beam radiations, etc.

Figure 15:
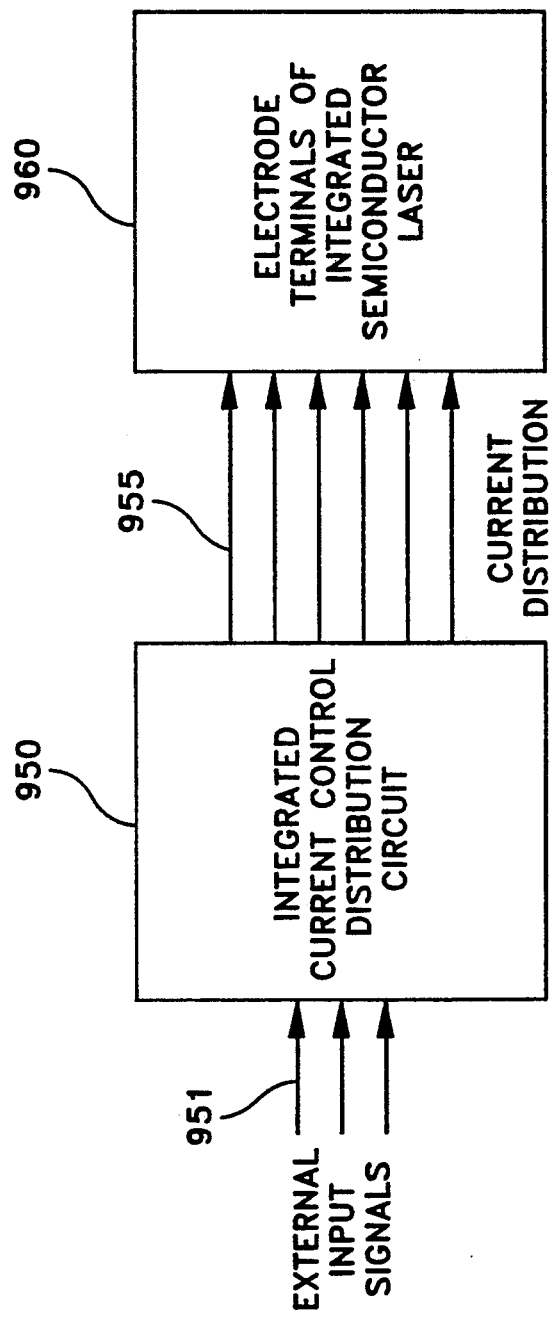
FIG. 15 is a block diagram of an integrated computing circuit formed in accordance with the integrated semiconductor laser of the present invention.

Referring to FIG. 15, an integrated computing circuit 950 having input terminals may be designed to compute from external input signals 951 the electrode terminal current distribution 955. Preferably, the integrated computing circuit 950 is capable of injecting the computed currents 955 into the appropriate electrode terminals of the integrated semiconductor laser 960. By using an integrated computing circuit in conjunction with the semiconductor laser of the present invention, the operator of the laser device need only apply the external input signal or beam control command to the input terminals of the integrated computing circuit 950 to accomplish a desired function. The operator would not have to be familiar with the internal operation of applying a current distribution since the required current distribution would be computed and applied by the integrated computing circuit 950 to achieve the input result.

Design of such integrated computing circuits within an integrated device is well known by those familiar with integrated circuit design. Integrated circuit design is not part of the present invention and will not be discussed further. Therefore, while the present invention uses a significant number of terminals within the extension chamber, the number of contacts which are ultimately brought out from the integrated circuit can be relatively few.

The following is an example of an application of the present invention to a communication system. This example serves to provide further appreciation of the invention but is not meant in any way to restrict the effective scope of the invention.

EXAMPLE

Application of laser with electronic directivity and focusing control to a laser optics open-air communication system (LOOC).

In the following example an integrated semiconductor laser having electronic direction and focusing control according to the present invention will be referred to as an "improved laser", and an integrated semiconductor laser light amplifier with electronic direction and focusing control in accordance with the present invention will be referred to as an "improved laser amplifier".

Figure 16:
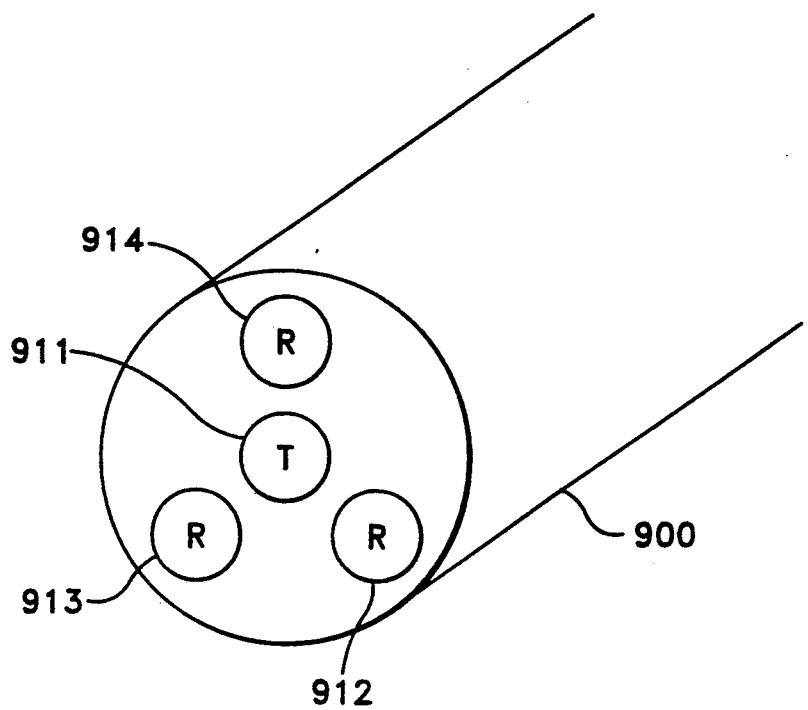
FIG. 16 is an illustration of the input/output end of a laser optics open-air communication terminal formed in accordance with the present invention.
Figure 17:
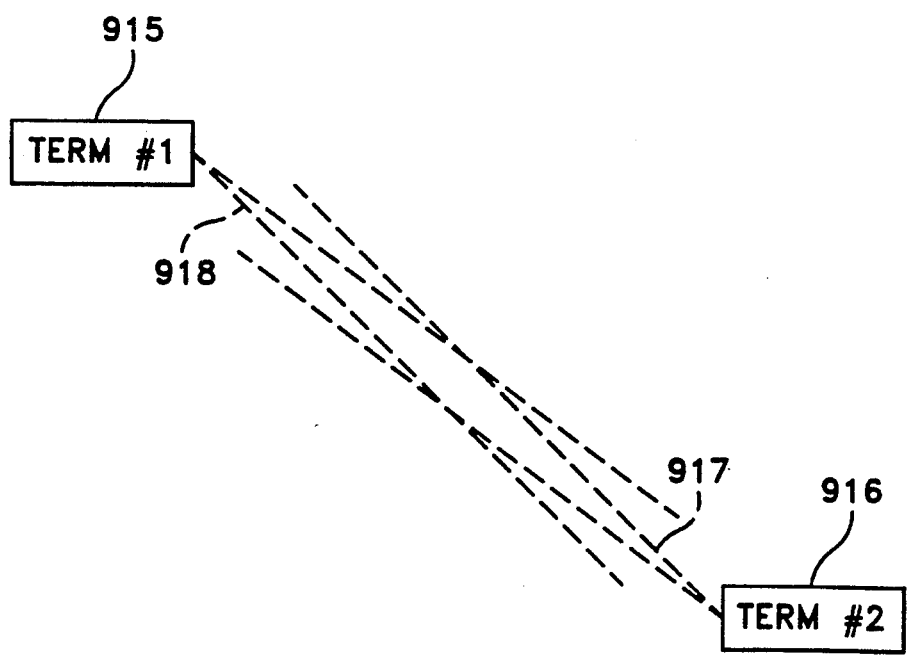
FIG. 17 is an illustration of two terminals of a laser optics open-air communication system formed in accordance with the present invention in communication with each other.
Figure 18:
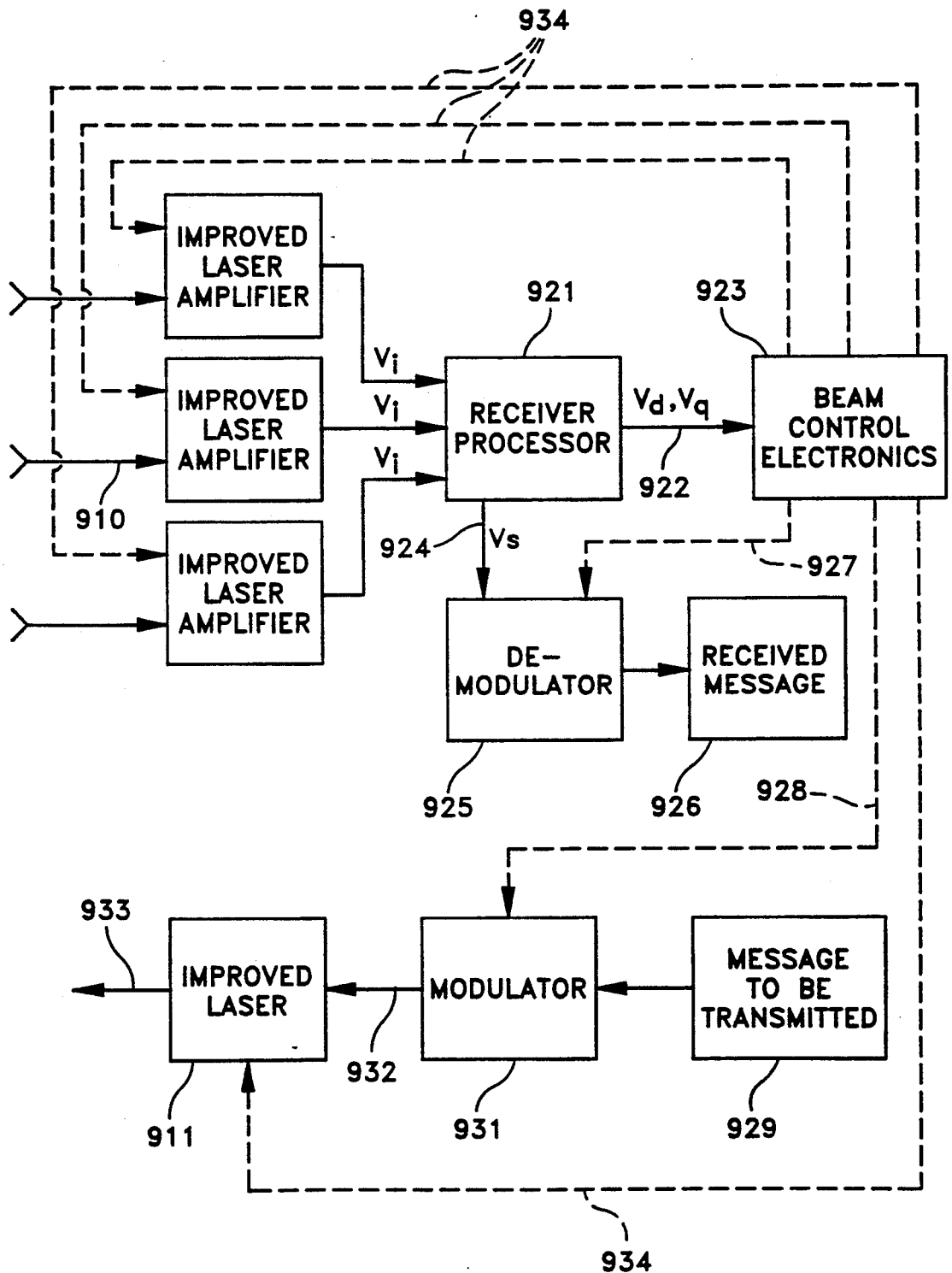
FIG. 18 is a block diagram of a laser optics open-air communication system terminal formed in accordance with the invention.

FIGS. 16, 17 and 18 refer to an application of an improved laser and improved laser light amplifier in a laser optics open air communication system (LOOC). Since there is no connecting optical fiber between the terminals in an LOOC, it is important for the terminals to have a wide receiving range, to be able to be directed at other terminals, and for a transmitted light beam to remain locked into a receiving terminal while communicating. The key to this process is to have a means for detecting the bias angle and the direction of bias of an incoming laser beam.

FIG. 16 illustrates a partial view of an LOOC system terminal 900. The LOOC system terminal 900 includes an improved laser 911 located at its center, the improved laser 911 is surrounded by a plurality of improved laser amplifiers 912, 913 and 914. In the terminal 900, the improved laser 911 is used as a transmitter and the improved laser amplifiers 912, 913 and 914 are used jointly as the input end of a receiver for incoming laser beams. The improved laser amplifiers 912, 913 and 914 have a light detecting diode connected to its input end facet for receiving an incoming laser beam signal. The light detecting diode has outputs to an LOOC system terminal receiver which computes and demodulates the incoming communication message. The beam direction of sensitivity of the receiving lasers 912, 913 and 914 move as a unit with the transmitting laser 911 beam direction. The beam direction of each receiving laser 912, 913 and 914 is biased outwardly by a fixed small angle.

The LOOC system can be defined by the following approximate analysis: Let p be a plane perpendicular to the transmitting laser 911 main beam with its origin at the point of interception. Let $z = x + jy$ be a complex coordinate system on p. Let m be the number of receiving lasers housed within the LOOC system terminal 900. For $m > 2$, the beam direction $z_i$ of the m receiving lasers can be described as $$z_i = Re^{j\theta_i}, \text{ where } \theta_i = \frac{2\pi(i-1)}{m}, \text{ and}$$

where $i = 1, 2, \ldots m$

Let $z_o = Ze^{j\theta_o}$ denote the direction of the incoming beam.

Each receiving laser has a light detecting diode (not shown) attached to its output port. The receiving lasers are most sensitive when $z = z$, and the output signal $v_i$ from the light detecting diode can be described as $$v_i = C_o I - C_1 I |z_i - z_o|^2$$

where $C_o$ and $C_1$ are constants and I is the incoming beam intensity. By multiplying the equation for the output signal $v_i$ by $\cos \theta_i$ and $\sin \theta_i$ and summing over i, position error signals $v_d$ and $v_q$ may be defined as follows:

$$v_d = \sum_{i=1}^{i=m} v_i \cos \theta_1 = mRZC_1 \cos \theta_o$$

$$v_q = \sum_{i=1}^{i=m} v_i \sin \theta_1 = mRZC_1 \sin \theta_o$$

The position error signals $v_d$ and $v_q$ provide the relative direction of the incoming beam. The main beam direction is then moved towards the incoming beam. Two identical or similar terminals are used and as the two main beams are directed towards each other, they are finally locked into position as shown in FIG. 16. While the two terminals 915 and 916 are usually not pointing towards each other, the output beams from each terminal 918 and 917 respectively, become locked into position.

The incoming communication signal $v_s$ can be calculated as:

$$v_s = \sum_{i=1}^{i=m} v_i = mI[C_o - C_1(R^2 + Z^2)]$$

where $v_s$ is the received signal. Once the two beams are locked into position, Z is negligibly small. According to the above equation, $v_s$ is proportional to the incoming light intensity $v_i$.

There are three phases of operation in an LOOC communication system:

1. The first phase is searching. The cone of radiation of at least two terminals are set at maximum to improve the probability that the terminals are in the cone of radiation for the other. During the searching phase, the laser beams move in search of each other according to a searching algorithm.

2. The second phase is approaching. The laser beams move toward each other and the cone of radiation is decreased in size to increase the signal strength. Automatic control of the beam directions for reducing the error signals $v_d$ and $v_q$ are used in the approaching phase.

3. The third phase is communicating. In the communication phase, the two laser beams are locked together by the automatic beam control system which corrects small errors. Automatic beam control continues to work simultaneously with the transmission of information from each terminal. During the communication phase, the sum of the output signals $v_i$ from the plurality of receiving lasers contains the information being received. The vector sums of the receiving lasers continue to give the position error information to the automatic beam control system to maintain the laser beams in locked communication.

FIG. 18 is a block diagram of an LOOC system terminal receiving and transmitting messages. Referring to FIG. 17, an incoming light beam 917 arrives at terminal 915, which has an input output end as shown in FIG. 16. The light beam 917 is amplified by the improved laser amplifiers 912, 913 and 914. A light detecting diode coupled to the output end of the laser amplifiers 912, 913 and 914 produce voltage signals $v_i$ from the input laser beam. The voltage signals $v_i$ are outputted to a terminal receiver processor 921. The receiver processor 921 amplifies the signals $v_i$ and computes error signals, $v_d$ and $v_q$ from $v_i$. The receiver processor 921 also sums the incoming light signals $v_i$ to produce the incoming communication signal $v_s$ 924.

The error signals, $v_d$ and $v_q$, 922 are provided to a beam control electronic circuit 923 which performs the searching and automatic beam control functions. Preferably, the beam control electronics 923 also provides input signals 934 to the improved laser 911 and laser amplifiers 912, 913, 914 in the LOOC terminal. The input signals 934 direct the output laser beam from the improved laser 911 as well as control the cones of sensitivity of the improved laser amplifiers 912, 913, and 914. Since the improved laser amplifiers are biased slightly outward, the input signals 934 are provided so that the improved laser 911 and improved laser amplifiers 912, 913, and 914 move in unison in their respective directions. Once the error signals, $v_d$ and $v_q$, 922 are reduced below a threshold value which indicates that the light beams from the two terminals are locked into position, the beam control electronics 923 provides a signal 927 to a demodulator 925 in the receiver and another signal 928 to a modulator 931 connected to the transmitting laser 911 to begin communication.

The computed communication signal $v_s$ 924 is demodulated to produce the received communication message 926. Upon the signal from the beam control electronics 923 to the modulator 931 of the transmitting laser, a message to be transmitted 929 is modulated by a transmitter modulator 931 to yield a voltage signal 932. The voltage signal 932 is applied to the transmitting laser 911 to control the intensity of its output laser beam 933.

While there have been described what are presently believed to be the preferred embodiments of the invention, those skilled in the art will realize that changes and modifications may be made thereto without departing from the spirit of the invention, and it is intended to claim all such changes and modifications as fall within the true scope of the invention.

What is claimed is:

1. An integrated semiconductor laser device, comprising:
    a lasing section having a first end facet and an internal port, and means defining a resonant cavity comprising a first semiconductor material situated between and coupled to the first end facet and the internal port; and
    an extension chamber having a second end facet and means defining an active channel comprising a second semiconductor material situated between and in communication with the internal port and the second end facet, the extension chamber having at least one electrode coupled to the active channel for applying a current to the active channel for injecting a minority carrier density distribution within the active channel for controlling laser light.

2. An integrated semiconductor laser device as defined by claim 1, wherein the extension chamber has a plurality of electrodes for injecting a minority carrier density distribution into the active channel for controlling laser light.

3. An integrated semiconductor laser device as defined by claim 1, wherein the active channel is partitioned longitudinally into a plurality of parallel active channel sections situated in a side-by-side arrangement.

4. An integrated semiconductor laser device as defined by claim 3, wherein the extension chamber includes a plurality of electrodes for injecting a minority carrier density distribution into the active channel sections for controlling laser light, each electrode being situated in alignment with and adjacent to a corresponding active channel section of the plurality of active channel sections.

5. An integrated semiconductor laser device as defined by claim 1, further comprising:
    a transition section having opposite first and second ends, the transition section being situated between and coupled to the lasing section at the first end thereof and the extension chamber at the second end thereof, the transition section having means defining a transition cavity situated between and coupled to the internal port at the first end and the extension chamber active channel at the second end, the transition cavity being funnel shaped such that the second end is wider than the first end.

6. An integrated semiconductor laser device as defined by claim 5, wherein the means defining the transition cavity comprises a semiconductor material which is substantially the same as the second semiconductor material of the extension chamber active channel, and wherein the second semiconductor material has a higher energy gap than the first semiconductor material of the lasing section resonant cavity.

7. An integrated semiconductor laser device as defined by claim 1, wherein the second semiconductor material of the extension chamber active channel has a higher energy gap than the first semiconductor material of the lasing section resonant cavity.

8. An integrated semiconductor laser device as defined by claim 1, wherein the extension chamber active channel includes a first section defining a phase control cavity and a second section defining a gain control cavity, the first section having a first end which is in communication with the internal port of the lasing section and a second end, the second section having a first end which is coupled to the second end of the first section and a second end coupled to the second end facet of the extension chamber.

9. An integrated semiconductor laser device as defined by claim 8, wherein the second semiconductor material of the extension chamber active channel has a higher energy gap than the first semiconductor material of the lasing section resonant cavity; wherein the gain control cavity is formed from a semiconductor material which is substantially the same as the first semiconductor material of the lasing section resonant cavity; and wherein the phase control cavity is formed from a semiconductor material which is substantially the same as the second semiconductor material of the extension chamber active channel.

10. An integrated semiconductor laser device as defined by claim 1, wherein the active channel is partitioned transversely into a plurality of first and second segments situated in an alternating arrangement, the first segments being formed of a third semiconductor material and the fourth segments being formed of a fourth semiconductor material, the third semiconductor material having an energy gap which is greater than the energy gap of the first semiconductor material of the lasing section resonant cavity, and the fourth semiconductor material having an energy gap which is less than the energy gap of the first semiconductor material of the lasing section resonant cavity.

11. An integrated semiconductor laser device as defined by claim 1, further comprising:
    a light detecting diode coupled to the first end facet for converting an incoming laser beam signal into a voltage signal.

12. An integrated semiconductor laser device as defined by claim 1, wherein the extension chamber active channel includes a plurality of sections having at least a first section and a second section, the first section having a first end in communication with the internal port of the lasing section and a second end, the second section having a first end which is coupled to the second end of the first section and a second end coupled to the second end facet of the extension chamber; and the second semiconductor material of the extension chamber active channel being heterogeneous in material composition.

13. An integrated semiconductor laser device as defined by claim 1, further comprising an integrated computing circuit having input terminals for receiving an external command signal, the integrated computing circuit being coupled to the electrode of the extension chamber and computing and applying electric current thereto in response to the external command signal applied to the input terminals of the integrated computing circuit.

14. A method of controlling a laser beam in an integrated semiconductor laser device, the integrated semiconductor laser device including a lasing section and an extension chamber, the lasing section having a first end facet, an internal port and means defining a resonant cavity comprising a first semiconductor material, the resonant activity being situated between and coupled to the first end facet and the internal port, and the extension chamber having a second end facet and means defining an active channel comprising a second semiconductor material situated between and in communication with the internal port and the second end facet, the extension chamber having at least one electrode coupled to the active channel, the method comprising the step of:

applying electric current to the extension chamber electrode for injecting a minority carrier density distribution into the active channel of the extension chamber, the minority carrier density distribution controlling the laser beam.

15. A laser optics open air communication system terminal comprising:

a transmitter integrated semiconductor laser device and a receiver integrated semiconductor laser device, each of the transmitter and receiver semiconductor laser device including a lasing section and an extension chamber, the lasing section having a first end facet and an internal port, and means defining a resonant cavity comprising a first semiconductor material situated between and coupled to the first end facet and the internal port, the extension chamber having a second end facet and means defining an active channel comprising a second semiconductor material situated between and in communication with the internal port and the second end facet, the extension chamber having at least one electrode coupled to the active channel for applying a current to the active channel for injecting a minority carrier density distribution within the active channel for controlling laser light, the receiver semiconductor laser device further including a light detecting diode coupled to the first end facet for detecting an incoming laser beam signal received by the receiver semiconductor laser device, the light detecting diode generating an output signal in response thereto;

means for amplifying and processing the output signal from the light detecting diode, the amplifying and processing means being coupled to the light detecting diode and generating first and second error signals and a communication signal in response to the output signal from the light detecting diode;

means for controlling the beam angle and focusing of the receiver semiconductor laser device, the angle and focusing controlling means being coupled to the amplifying and processing means and being responsive to the first and second error signals and providing an output signal in response thereto;

means for demodulating the communication signal from the amplifying and processing means, the demodulating means being coupled to the amplifying and processing means and the angle and focusing control means, the demodulating means being responsive to the output signal provided by the angle and focusing control means and providing a demodulated communication signal in response thereto; and means for modulating a communication signal to be transmitted, the modulating means being coupled to the transmitter integrated semiconductor laser device and the angle and focusing controlling means, the modulating means being responsive to the output signal from the angle and focusing controlling means and providing a signal to the transmitter integrated semiconductor laser device for transmitting an output communication laser beam.

16. A laser optics open air communication system, comprising:

a plurality of laser optics open air communication system terminals as defined by claim 15, at least one terminal of the plurality of laser optics terminals communicating by laser beam with another terminal of the plurality of laser optics terminals.

* * * * *

UNITED STATES PATENT AND TRADEMARK OFFICE
CERTIFICATE OF CORRECTION

PATENT NO. : 5,233,623

DATED : August 3, 1993

INVENTOR(S) : Chang

It is certified that error appears in the above-indentified patent and that said Letters Patent is hereby corrected as shown below:

Column 1, line 16, change "i" to --in--;

Column 1, line 20, change "The" to --These--;

Column 3, line 13, after "the" insert --present--;

Column 4, line 48, delete "Table of material composition $Ga_{1-x}Al_xAs$";

Column 12, line 1, change "contact" to --contacts--;

Column 12, line 24, change "$I_d\frac{1}{2}(I_{46}-I_{45})$" to --$I_d=\frac{1}{2}(I_{46}-I_{45})$--;

Column 15, line 35, change "$Re^{j\theta i}$" to --$Re^{j\theta_i}$--;

Column 15, line 39, change "$Ze^{j\theta o}$" to --$Ze^{j\theta_o}$--;

UNITED STATES PATENT AND TRADEMARK OFFICE
CERTIFICATE OF CORRECTION

PATENT NO. : 5,233,623
DATED : August 3, 1993
INVENTOR(S) : Chang

It is certified that error appears in the above-indentified patent and that said Letters Patent is hereby corrected as shown below:

Column 15, line 43, change "z=z" to $--z_o=z_i--$.

Signed and Sealed this

Thirty-first Day of May, 1994

Attest:

BRUCE LEHMAN

Attesting Officer     Commissioner of Patents and Trademarks